(12) United States Patent
Kawashima et al.

(10) Patent No.: US 8,471,235 B2
(45) Date of Patent: Jun. 25, 2013

(54) NONVOLATILE MEMORY ELEMENT HAVING A RESISTANCE VARIABLE LAYER AND MANUFACTURING METHOD THEREOF

(75) Inventors: Yoshio Kawashima, Osaka (JP); Takumi Mikawa, Shiga (JP); Zhiqiang Wei, Osaka (JP); Atsushi Himeno, Osaka (JP)

(73) Assignee: Panasonic Corporation, Osaka (JP)

( * ) Notice: Subject to any disclaimer, the term of this patent is extended or adjusted under 35 U.S.C. 154(b) by 95 days.

(21) Appl. No.: 13/132,822

(22) PCT Filed: Dec. 4, 2009

(86) PCT No.: PCT/JP2009/006618
§ 371 (c)(1),
(2), (4) Date: Jun. 3, 2011

(87) PCT Pub. No.: WO2010/064444
PCT Pub. Date: Jun. 10, 2010

(65) Prior Publication Data
US 2011/0233511 A1      Sep. 29, 2011

(30) Foreign Application Priority Data
Dec. 5, 2008   (JP) .................................. 2008-310710

(51) Int. Cl.
*H01L 29/02*   (2006.01)
(52) U.S. Cl.
USPC ..... 257/4; 257/2; 257/3; 257/5; 257/E29.002; 438/102; 438/103; 438/104; 365/163

(58) Field of Classification Search
USPC ............... 257/1–5, E29.002; 438/3; 365/163
See application file for complete search history.

(56) References Cited

U.S. PATENT DOCUMENTS

| | | |
|---|---|---|
| 2005/0247921 A1 | 11/2005 | Lee et al. |
| 2006/0120205 A1 | 6/2006 | Odagawa et al. |
| 2007/0240995 A1 | 10/2007 | Odagawa et al. |
| 2007/0267675 A1 | 11/2007 | Cho et al. |
| 2008/0001172 A1* | 1/2008 | Karg et al. .................... 257/194 |
| 2008/0111245 A1* | 5/2008 | Osano et al. .................. 257/767 |
| 2009/0052225 A1 | 2/2009 | Morimoto |
| 2009/0096568 A1 | 4/2009 | Hosoi et al. |

(Continued)

FOREIGN PATENT DOCUMENTS

| | | |
|---|---|---|
| JP | 2005-120421 | 5/2005 |
| JP | 2008-072031 | 3/2008 |

(Continued)

*Primary Examiner* — Jami M Valentine
(74) *Attorney, Agent, or Firm* — McDermott Will & Emery LLP

(57) ABSTRACT

A nonvolatile memory element includes a substrate; a lower electrode layer and a resistive layer sequentially formed on the substrate; a resistance variable layer formed on the resistive layer; a wire layer formed above the lower electrode layer; an interlayer insulating layer disposed between the substrate and the wire layer and covering at least the lower electrode layer and the resistive layer, the interlayer insulating layer being provided with a contact hole extending from the wire layer to the resistance variable layer; and an upper electrode layer formed inside the contact hole such that the upper electrode layer is connected to the resistance variable layer and to the wire layer; resistance values of the resistance variable layer changing reversibly in response to electric pulses applied between the lower electrode layer and the upper electrode layer.

13 Claims, 9 Drawing Sheets

U.S. PATENT DOCUMENTS

| | | |
|---|---|---|
| 2009/0200640 A1 | 8/2009 | Hosoi et al. |
| 2009/0218565 A1 | 9/2009 | Kawano et al. |
| 2009/0224224 A1 | 9/2009 | Fujii et al. |
| 2009/0250678 A1 | 10/2009 | Osano et al. |
| 2009/0283736 A1* | 11/2009 | Kanzawa et al. ............... 257/2 |
| 2010/0014344 A1* | 1/2010 | Wu et al. ................. 365/148 |
| 2010/0207094 A1* | 8/2010 | Kanzawa et al. ............... 257/4 |
| 2011/0044088 A1* | 2/2011 | Muraoka et al. ........... 365/148 |
| 2011/0059576 A1 | 3/2011 | Cho et al. |

FOREIGN PATENT DOCUMENTS

| | | |
|---|---|---|
| WO | WO 2006/075574 A1 | 7/2006 |
| WO | WO 2007/138646 A1 | 12/2007 |
| WO | WO 2008/047770 A1 | 4/2008 |
| WO | WO 2008/059701 A1 | 5/2008 |
| WO | WO 2008/126365 A1 | 10/2008 |
| WO | WO 2008/149484 A1 | 12/2008 |

* cited by examiner

NONVOLATILE MEMORY ELEMENT HAVING A RESISTANCE VARIABLE LAYER AND MANUFACTURING METHOD THEREOF

RELATED APPLICATIONS

This application is the U.S. National Phase under 35 U.S.C. §371 of International Application No. PCT/JP2009/006618, filed on Dec. 4, 2009, which in turn claims the benefit of Japanese Application No. 2008-310710, filed on Dec. 5, 2008, the disclosures of which Applications are incorporated by reference herein.

TECHNICAL FIELD

The present invention relates to a nonvolatile memory element for storing data using a material which changes its resistance values reversibly in response to electric pulses applied thereto, and a manufacturing method thereof.

BACKGROUND ART

With recent advancement of digital technologies for electronic equipment, there have been increasing demands for larger-capacity and nonvolatile memory devices to store data of music, images, information, and so on. In one approach for responding to such demands, an attention has been focused on a nonvolatile memory device (hereinafter referred to as ReRAM (resistive random access memory)) including as a memory element a resistance variable layer which changes its resistance values in response to electric pulses applied thereto and retains the changed resistance values. This is because the nonvolatile memory device has a relatively simple structure as a memory element, makes it easy to provide a higher density, is highly compatible with conventional semiconductor process steps, etc. In this ReRAM, there is a need for materials which allow their resistance values to change with stability and with high reproducibility as designed in a miniaturized configuration of the memory element including the resistance variable layer, and establishment of manufacturing process steps thereof, and study and development for them have been made vigorously.

As a structure for enabling higher-dense integration, there is known a configuration, in which a memory cell including a memory element comprising a resistance variable layer and a two-terminal element having a non-linear current-voltage characteristic is provided in a region where a word line crosses a bit line (first Prior Art Example, e.g., see Patent Literature 1). It is recited that, in such a configuration, a switching characteristic (characteristic in which the non-linear element is placed in an electrically-conductive state or in a non-electrically-conductive state depending on whether or not an applied voltage exceeds a threshold) of the non-linear element can improve selectivity of a memory cell, and therefore, it is possible to implement a ReRAM having a higher density and being accessible at high-speeds.

There is also known a ReRAM implementing a more miniaturized structure. For example, there is known a memory device using a pore structure utilizing nano-holes (second Prior Art Example, e.g., see Patent Literature 2). In this memory device, a memory element including a lower electrode, a memory layer and an upper electrode, or the like, which are filled into a nano-hole structure formed by anode oxidization, is fabricated as the pore structure. It is said that this makes it possible to manufacture a ferroelectric element or a resistance variable element with a large effective area, and hence a semiconductor memory with a higher surface density and a larger capacity.

CITATION LISTS

Patent Literature

Patent Literature 1: Japanese Laid-Open Patent Application Publication No. 2006-203098

Patent Literature 2: Japanese Laid-Open Patent Application Publication No. 2005-120421

SUMMARY OF THE INVENTION

Technical Problem

In first Prior Art Example, since the switching characteristic of the non-linear element can improve selectivity of a memory cell, it becomes possible to implement a higher density and high-speed accessability. However, first Prior Art Example does not specifically recite a manufacturing method of the memory element including the resistance variable layer and the non-linear element which are provided at the region where the word line crosses the bit line. For example, for the configuration disclosed in first Prior Art Example, the memory cell could be formed by dry etching, or the like. However, if the memory cell is formed by dry etching, or the like, the side wall of a variable resistive body as a memory section of a variable resistive element could be damaged by etching or the like, and thereby the characteristic of the memory section is degraded, for example, the memory section decreases its resistance (gets short-circuited) or increases its resistance (gets open-circuited), which is likely to increase a variation in characteristic of memory cells. That is, a stable memory capability is not attained.

In second Prior Art Example, since the memory element including the lower electrode, the memory layer and the upper electrode, or the like, which are filled into the nano-hole structure, is fabricated as the pore structure, a larger capacity is attained. However, in a configuration disclosed in, for example, second Prior Art Example, a plurality of materials different from each other are filled into the miniaturized nano-hole, to form the lower electrode, the memory layer, and the upper electrode into the nano-hole. In this configuration, the memory layer extends in a thin tubular region sandwiched between the columnar upper electrode located at the center of the nano-hole and the tubular lower electrode formed along the inner wall of the nano-hole. For this reason, if a hole in which a contact connected to the upper electrode is formed is not more miniaturized than the nano-hole structure constituting the memory element, then, the upper electrode and the lower electrode will get short-circuited, and a memory function cannot be performed. To allow the hole miniaturized more than the miniaturized nano-hole structure to be positioned stably only on the upper electrode, it is necessary to develop a new technique to implement this. Therefore, the second Prior Art Example is not compatible with the conventional semiconductor process steps. In other words, it is difficult to miniaturize the structure disclosed in the second Prior Art Example, in the conventional semiconductor process steps.

The present invention is directed to solving the above described problem, and an object of the present invention is to provide a nonvolatile memory element which enables achievement of miniaturization and has a stable memory capability, and a manufacturing method thereof.

Solution to Problem

To achieve the above described object, a nonvolatile memory element of the present invention comprises a substrate; a lower electrode layer formed on the substrate; a resistive layer formed on the lower electrode layer and comprising an oxygen-deficient metal oxide which is an oxide of metal including an element of one kind or elements of a plurality of kinds which is or are selected from transition metals; a resistance variable layer formed on the resistive layer and comprising an oxygen-deficient metal oxide which has a higher oxygen content than the resistive layer; a wire layer formed above the lower electrode layer; an interlayer insulating layer disposed between the substrate and the wire layer and covering at least the lower electrode layer and the resistive layer, the interlayer insulating layer being provided with a contact hole extending from the wire layer to the resistance variable layer; and an upper electrode layer formed inside the contact hole such that the upper electrode layer is connected to the resistance variable layer and to the wire layer; resistance values of the resistance variable layer changing reversibly in response to electric pulses applied between the lower electrode layer and the upper electrode layer. As defined herein, in general interpretation, the phrase "the lower electrode layer is formed on the substrate" is meant to include a configuration in which "the lower electrode layer is formed directly on the substrate" and a configuration in which "the lower electrode layer is formed on the substrate with another constituents intervening between them." As defined herein, the phrase "when viewed in a thickness direction of the substrate" means "constituents are seen through or not seen through when viewed in a thickness direction of the substrate." As defined herein, the term "interlayer insulating layer" is meant to include an interlayer insulating layer formed in one process step of manufacturing process steps of the nonvolatile memory element and an interlayer insulating layer including a plurality of interlayer insulating layers joined together which are formed individually in a plurality of process steps of the manufacturing process steps.

In accordance with this configuration, since the resistance variable layer is located within the resistive layer, when viewed in the thickness direction of the substrate, the resistance variable layer constituting the memory section is less likely to be affected by the damages to the resistive layer which would be caused by dry etching or the like in manufacturing process steps. As a result, it is possible to prevent a region between the upper electrode layer and the lower electrode layer from decreasing its resistance (getting short-circuited) or increasing its resistance (getting open-circuited), and hence attain a stable memory capability. In addition, the memory section is the resistance variable layer sandwiched between the lower electrode layer and the upper electrode layer and is formed at the bottom of the contact hole. For this reason, a basic constituent unit of the memory element having the memory section is determined by a manufacturing process step of the contact hole formed in the interlayer insulating layer and filled with the upper electrode layer. Therefore, the basic constituent unit of the memory element can be miniaturized up to a minimum size of a process rule in the manufacturing process step. As a result, the nonvolatile memory element can be miniaturized. Furthermore, the resistance variable layer, the upper electrode layer and the lower electrode layer are respectively formed on a flat substrate in individual process steps of normal semiconductor process steps and can be manufactured in a standard manner by the same mask process (e.g., CMOS process) as the mask process for forming the constituents other than the memory section. As a result, the nonvolatile memory element with high reliability is easily attainable in simple process steps.

It is preferable that the resistance variable layer is entirely located within the resistive layer when viewed in a thickness direction of the substrate, and the contact hole reaches only the resistance variable layer.

In accordance with this configuration, since the resistance variable layer is entirely located within the resistive layer, when viewed in the thickness direction of the substrate, the resistance variable layer constituting the memory section can be prevented from being affected by the damages to the resistive layer which would be caused by dry etching or the like in manufacturing process steps.

It is preferable that the oxygen-deficient metal oxide is an oxygen-deficient tantalum oxide $TaO_x$ ($0<x<2.5$). In accordance with this configuration, a stable resistance changing operation is attained.

The resistance variable layer may be formed in such a manner that the lower electrode layer and the resistive layer are sequentially formed on the substrate, then the interlayer insulating layer is formed over the substrate to cover the lower electrode layer and the resistive layer, then the contact hole is formed to penetrate the interlayer insulating layer and reach the resistive layer, and then a portion of the resistive layer which is exposed at a bottom of the contact is oxidized.

The nonvolatile memory element may comprise a first wire layer formed in a band shape on the substrate, and a second wire layer formed above the first wire layer in a band shape to three-dimensionally cross the first wire layer, the second wire layer being the wire layer; and the first wire layer may have a structure in which the lower electrode layer formed in a band shape and the resistive layer formed in a band shape are sequentially stacked on the substrate; the resistance variable layer may be formed on a portion of the resistive layer of the first wire layer which is located at a three-dimensional crosspoint of the first wire layer and the second wire layer; the interlayer insulating layer may be disposed between the substrate and the second wire layer, may be provided with the contact hole extending from the second wire layer to the resistance variable layer, and may cover at least the first wire layer; and the upper electrode layer may be formed inside the contact hole such that the upper electrode layer is connected to the resistance variable layer and to the second wire layer. In accordance with such a configuration, it is possible to implement a cross-point nonvolatile memory element which attains a stable memory capability and can be miniaturized.

A plurality of first wire layers may be arranged to be spaced apart from each other; and a plurality of second wire layers may be arranged to be spaced apart from each other and to cross the plurality of first wire layers, respectively, when viewed in a thickness direction of the substrate; and the resistance variable layer, the contact hole and the upper electrode layer may be formed at each of cross-points of the first wire layers and the second wire layers when viewed in the thickness direction of the substrate. In accordance with such a configuration, it is possible to implement a large-capacity cross-point nonvolatile memory element which attains a stable memory capability and can be miniaturized.

The resistance variable layer may be formed in such a manner that the lower electrode layer and the resistive layer are sequentially stacked in a band shape on the substrate, then the interlayer insulating layer is formed over the substrate to cover the lower electrode layer and the resistive layer, then the contact hole is formed to penetrate the interlayer insulating layer and reach the resistive layer, and then a portion of the resistive layer which is exposed at a bottom of the contact is oxidized.

It is preferable that a non-ohmic element may be formed between the lower electrode layer and the second wire layer such that the non-ohmic element is connected in series with the resistance variable layer; and the non-ohmic element may have a voltage-current characteristic in which an increasing rate of an absolute value of a current with respect to an increase in an absolute value of a voltage increases as the absolute value of the voltage increases, in at least a certain voltage range. In accordance with this configuration, it is possible to prevent a write error and a read error due to cross-talk.

The non-ohmic element may be formed between the resistance variable layer and the second wire layer.

The non-ohmic element may be a MIM diode, a MSM diode or a varistor.

A method of manufacturing a nonvolatile memory element of the present invention, including a resistance variable layer, resistance values of which change reversibly, by applying electric pulses between a lower electrode and an upper electrode of the nonvolatile memory element, the method comprises a step A of sequentially forming, on a substrate, a lower electrode layer, and a resistive layer comprising an oxygen-deficient metal oxide which is an oxide of metal including an element of one kind or elements of a plurality of kinds which is or are selected from transition metals; a step B of forming an interlayer insulating layer over the substrate subjected to the step A such that the interlayer insulating layer covers the lower electrode layer and the resistive layer; a step C of forming a contact hole such that the contact hole penetrates the interlayer insulating layer and reaches the resistive layer; a step D of oxidizing a portion of the resistive layer which is exposed at a bottom of the contact hole to form the resistance variable layer comprising an oxygen-deficient metal oxide having a higher oxygen content than the resistive layer; a step E of filling an electrically-conductive material into the contact hole to form the upper electrode layer into the contact hole such that the upper electrode layer is connected to the resistance variable layer; and a step F of forming a wire layer on the interlayer insulating layer such that the wire layer is connected to the upper electrode layer.

In accordance with this configuration, since the resistance variable layer is located within the resistive layer, when viewed in the thickness direction of the substrate, it is possible to manufacture a nonvolatile memory element having a stable memory capability. In addition, it is possible to miniaturize the nonvolatile memory element. Furthermore, it is possible to easily manufacture the nonvolatile memory element with a high reliability in simple process steps.

It is preferable that in the step C, the contact hole is formed such that a bottom of the contact hole is entirely located within the resistive layer when viewed in a thickness direction of the substrate. In accordance with this configuration, the resistance variable layer constituting the memory section can be prevented from being affected by the damages to the resistive layer which would be caused by dry etching or the like in manufacturing process steps.

In the step A, a plurality of band-shaped stacked structures including a plurality of lower electrode layers and a plurality of resistive layers may be formed on the substrate such that the stacked structures are arranged to be spaced apart from each other, and the stacked structures constitute first wire layers, respectively; in the step B, the interlayer insulating layer may be formed over the substrate subjected to the step A to cover the plurality of first wire layers; in the step C, a plurality of contact holes may be formed to reach a plurality of portions (planned three-dimensional cross-point portions) arranged in a longitudinal direction of the resistive layer in each of the first wire layers, and the plurality of planned three-dimensional cross-point portions in each of the first wire layers may be positioned at points where the plurality of first wire layers will cross the plurality of second wire layers each constituting the wire layer, respectively; in the step D, portions of the resistive layers which are respectively exposed at bottoms of the plurality of contact holes may be oxidized to form a plurality of resistance variable layers, respectively; in the step E, a plurality of upper electrode layers may be formed into the plurality of contact holes such that the upper electrode layers are connected to the resistance variable layers corresponding to the contact holes, respectively; and in the step F, a plurality of second wire layers may be formed on the interlayer insulating layer such that the second wire layers are connected to the plurality of upper electrode layers corresponding to the plurality of planned three-dimensional cross-point portions in each of the first wire layers, respectively such that the second wire layers cross the plurality of first wire layers, respectively when viewed in the thickness direction of the substrate. In accordance with such a configuration, it is possible to manufacture a large-capacity cross-point nonvolatile memory element which has a stable memory capability, can be miniaturized, and has a high reliability, in simple process steps.

In the step D, the portions of the resistive layers may be oxidized by plasma oxidization of the resistive layers in oxygen atmosphere.

In the step D, the portions of the resistive layers may be oxidized by heating the substrate in oxygen atmosphere.

In the step D, the portions of the resistive layers may be oxidized by implanting oxygen ions into the resistive layers.

It is preferable that in steps including the step E and the step F, a non-ohmic element is formed between the resistance variable layer and the wire layer; and the non-ohmic element has a voltage-current characteristic in which an increasing rate of an absolute value of a current with respect to an increase in an absolute value of a voltage increases as the absolute value of the voltage increases, in at least a certain voltage range. In accordance with this configuration, it is possible to prevent a write error and a read error due to cross-talk.

The non-ohmic element may be a MIM diode, a MSM diode or a varistor.

The above and further objects, features and advantages of the present invention will more fully be apparent from the following detailed description of preferred embodiments with accompanying drawings.

Advantageous Effects of the Invention

The present invention is configured as described above and achieves advantages that it is possible to provide a nonvolatile memory element which can be miniaturized and has a stable memory capability, and a manufacturing method thereof.

BRIEF DESCRIPTION OF THE DRAWINGS

FIGS. 1A and 1B are views showing a configuration of a nonvolatile memory element according to Embodiment 1 of the present invention, in which FIG. 1A is a plan view, FIG. 1B is a cross-sectional view taken along line IB-IB of FIG. 1A.

FIGS. 4A and 4B are views showing a configuration of a nonvolatile memory element according to Embodiment 2 of the present invention, in which FIG. 4A is a plan view, and FIG. 4B is a cross-sectional view taken along line IVB-IVB of FIG. 4A.

FIGS. 7A and 7B are views showing a configuration of a nonvolatile memory element according to Embodiment 3 of the present invention, in which FIG. 7A is a plan view, and FIG. 7B is a cross-sectional view taken along line VIIB-VIIB of FIG. 7A.

DESCRIPTION OF EMBODIMENTS

Figure 1A:
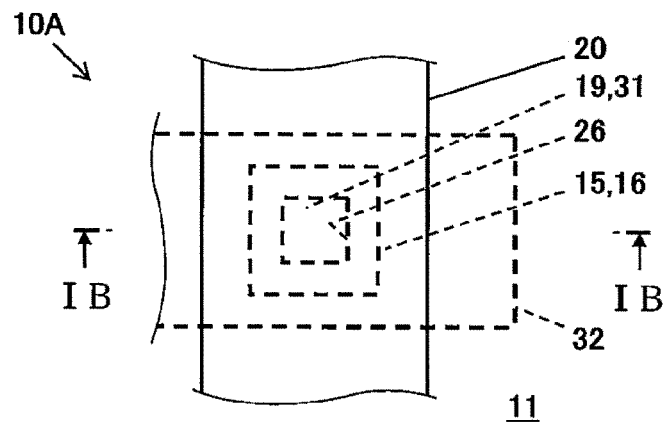

Hereinafter, preferred embodiments of the present invention will be described with reference to the drawings. Throughout the drawings, the same reference numerals are assigned to the same or corresponding constituents and description thereof is omitted in some cases.

(Embodiment 1)

[Configuration of Nonvolatile Memory Element]

Figure 1B:
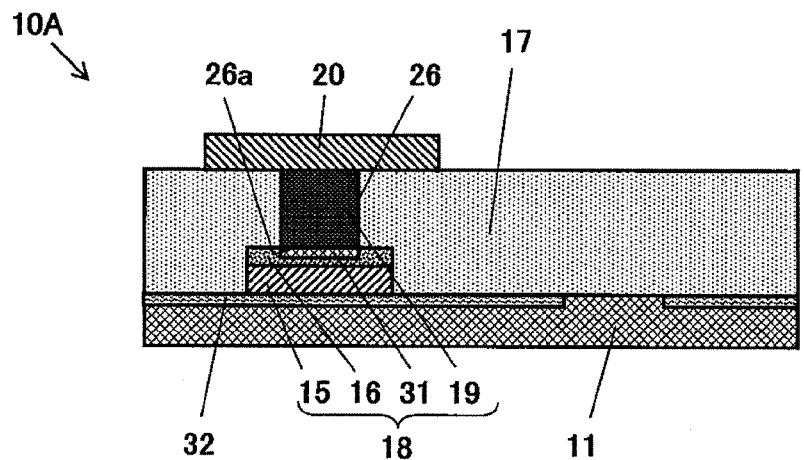
Figure 1C:
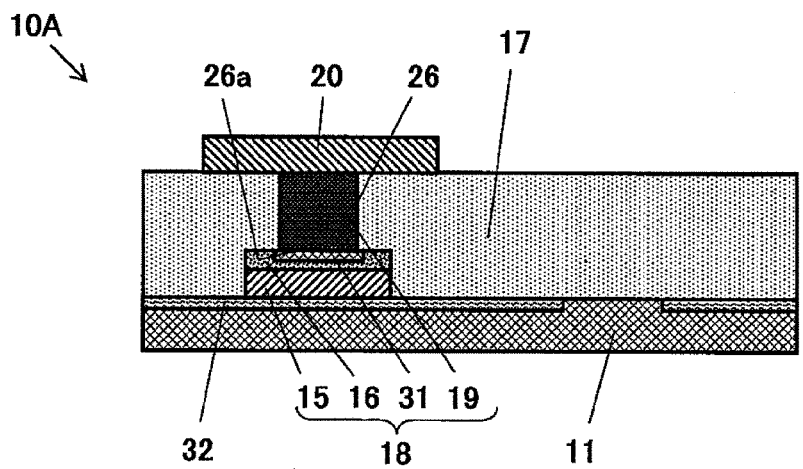
FIG. 1C is a cross-sectional view showing another exemplary configuration of a resistance variable layer.

FIGS. 1A and 1B are views showing a configuration of a nonvolatile memory element according to Embodiment 1 of the present invention, in which FIG. 1A is a plan view, FIG. 1B is a cross-sectional view taken along line IB-IB of FIG. 1A, and FIG. 1C is a cross-sectional view showing another exemplary configuration of a resistance variable layer. In FIG. 1A, an interlayer insulating layer 17 (see FIG. 1B) is transparently drawn, and the interlayer insulating layer is omitted.

With reference to FIGS. 1A and 1B, a nonvolatile memory element 10A of this embodiment includes a substrate 11. The substrate 11 is made of a silicon semiconductor or the like. In this embodiment, the substrate 11 is provided with a semiconductor integrated circuit (not shown) into which a nonvolatile memory element 10A is incorporated. A wire pattern 32 of the semiconductor integrated circuit is formed on the substrate 11. On the wire pattern 32, a lower electrode layer 15 is formed. The semiconductor integrated circuit and the wire pattern 32 are illustrated to explain the use of the nonvolatile memory element 10A. Therefore, the semiconductor integrated circuit and the wire pattern 32 need not always be provided on the substrate 11. If the wire pattern 32 is omitted, for example, the lower electrode layer 15 may be formed on the substrate 11 without any constituents intervening between them and may also serve as the wire pattern 32. The nonvolatile memory element 10A and the semiconductor integrated circuit constitute a nonvolatile memory device.

On the lower electrode layer 15, a resistive layer 16 is formed. On the resistive layer 16, a resistance variable layer 31 is formed. Furthermore, over the substrate 11, an interlayer insulating layer 17 is formed to cover the wire pattern 32, the lower electrode layer 15, the resistive layer 16 and the resistance variable layer 31 (to be precise, the interlayer insulating layer 17 is not present immediately on the resistance variable layer 31 but a contact hole 26 is present thereon). The contact hole 26 is formed to penetrate the interlayer insulating layer 17 and reach the resistance variable layer 31. As shown in FIG. 1B, the entire of a bottom (lower opening) 26a of the contact hole 26 is located within the resistive layer 16 when viewed in a thickness direction of the substrate 11. The location of the bottom 26a of the contact hole 26 on the resistive layer 16 is predetermined. The bottom 26a of the contact hole 26 substantially conforms to the resistance variable layer 31 (substantially entirely overlaps with it) when viewed in a thickness direction of the substrate 11. In other words, the contact hole 26 is formed in the interlayer insulating layer 17 to reach only the resistance variable layer 31. The resistance variable layer 31 has a certain thickness from its surface exposed in the bottom 26a of the contact hole 26.

Inside the contact hole 26, an upper electrode layer 19 is formed into the contact hole 26 to fill the contact hole 26. This allows the upper electrode layer 19 to be connected at its lower surface (lower end) to the resistance variable layer 31. When viewed in the thickness direction of the substrate 11, the upper electrode layer 19 substantially conforms to the resistance variable layer 31 (substantially entirely overlaps with it). This is due to the fact that a portion of the resistive layer 16 which is exposed at the bottom the contact hole 26 is oxidized into the resistance variable layer 31 after forming the contact hole 26, and thereby the resistance variable layer 31 is inevitably formed at the bottom surface of the upper electrode layer 19. Therefore, a voltage can be applied surely to the resistance variable layer 31 without causing a short-circuit.

It should be noted that the following is important. To allow the voltage to be applied to the resistance variable layer 31 while preventing the upper electrode layer 19 and the resistive layer 16 from getting short-circuited with each other, it is sufficient that the entire of the upper electrode layer 19 is located within the resistance variable layer 31 when viewed in the thickness direction of the substrate 11. Therefore, the positional relationship between the upper electrode layer 19 (hence contact hole 26) and the resistance variable layer 31 need not always be the positional relationship shown in FIG. 1B, but may be the positional relationship shown in FIG. 1C. In that case, also, the contact hole 26 is formed in the interlayer insulating layer 17 to reach only the resistance variable layer 31. As shown in FIG. 1C, the resistance variable layer 31 extends to have a larger area than the entire of the upper electrode layer 19 when viewed in the thickness direction of the substrate 11. In other words, the resistance variable layer 31 extends outwardly relative to the contact hole 26 with a width substantially equal to the thickness of the resistance variable layer 31. In other words, the resistive layer 16 is oxidized (described later) and thereby oxygen diffuses from the bottom 26a of the contact hole 26, thus forming the resistance variable layer 31. When the resistance variable layer 31 is formed by oxidizing the resistive layer 16, it is formed as shown in FIG. 1B or as shown in FIG. 1C, depending on oxidization conditions, etc.

When viewed in the direction of the substrate 11, the entire of resistance variable layer 31 is located within the resistive layer 16. In accordance with this configuration, since the resistance variable layer 31 is sufficiently away from the side surface of the resistive layer 16, the characteristic of the resistance variable layer 31 is not degraded by degradation of the side surface. In other words, an area (area formed by contact surfaces) of a portion of the resistive layer 16 and a portion of the lower electrode layer 15 which are joined together, is set larger than an area of a portion of the resistance variable layer 31 and a portion of the upper electrode layer 19 which are joined together. In other words, the side surface of the resistive layer 16 and the side surface of the upper electrode layer 19 are not aligned up so that they are not connected to each other.

On the upper surface of the interlayer insulating layer 17, as shown in FIGS. 1A and 1B, a wire layer 20 is formed to extend on the upper end (upper surface) of the upper electrode layer 19. This allows the upper electrode layer 19 formed in the contact hole 26 to be connected to the wire layer 20.

In the above configuration, the resistance variable layer 31 constitutes a memory section which changes its resistance values reversibly by applying electric pulses. The lower electrode layer 15, the resistive layer 16, the resistance variable layer 31 and the upper electrode layer 19 constitute a memory element 18 for storing information by utilizing a change in the resistance values of the memory section.

The wire layer 20 comprises a material such as aluminum (Al), or copper (Cu). The lower electrode layer 15 comprises an electrode material such as aluminum (Al), copper (Cu), or tantalum nitride (TaN). The upper electrode layer 19 comprises an electrically-conducive material such as tungsten (W), tantalum nitride (TaN), or platinum (Pt).

The resistive layer 16 comprises a material which is electrically conductive and has a resistance. Nonetheless, in order to attain a stable memory capability, it is preferable that the resistive layer 16 substantially comprises an oxygen-deficient metal oxide which is an oxide of transition metal. The transition metal may comprise an element of one kind or elements of a plurality of kinds. In this embodiment, the resistive layer 16 substantially comprises the oxygen-deficient metal oxide which is an oxide of transition metal. The reason why the resistive layer 16 comprises any one of these materials is that a portion of an original layer comprising any one of these materials is oxidized to form the resistance variable layer 31 which is the oxidized portion of the original layer and the resistive layer 16 which is a remaining portion of the original layer, as will be described later. Therefore, the resistive layer 16 is made of a material comprising a transition metal element which is the same as the transition metal element of the oxygen-deficient metal oxide which is the oxide of transition metal, and constitutes the resistance variable material 31, and is less in oxygen content than the oxygen-deficient metal oxide constituting the resistance variable layer 31.

The resistive variable layer 31 comprises a material which changes its resistance values reversibly by applying electric pulses. In order to attain a stable memory capability, it is preferable that the resistance variable layer 31 substantially comprises the oxygen-deficient metal oxide which is the oxide of transition metal. The transition metal may comprise an element of one kind or elements of a plurality of kinds. In this embodiment, the resistance variable layer 31 comprises this material. It should be noted that the material constituting the resistance variable layer 31 contains oxygen in larger quantity than the material constituting the resistive layer 16. When the resistance variable layer 31 is formed in a manufacturing method as described later, the resistance variable layer 31 is defined as a layer formed by oxidizing the resistive layer 61 (to be precise, its original layer).

A variety of oxygen-deficient transition metal oxides which are oxides of transition metals, and change their resistances reversibly by applying electric pulses, are known. For example, there are $HfO_x$ and $TaO_x$. Among the resistance variable materials, $TaO_x$ (oxygen-deficient tantalum oxide) is preferable because it changes its resistance stably under specified conditions (certain conditions). In this embodiment, a configuration in which $TaO_x$ is used as the resistance variable layer 31 will be described. Hereinafter, $TaO_x$ will be described in detail.

<Preferable Composition Range of $TaO_x$>

In a suitable composition range of $TaO_x$, x satisfies $0<x<2.5$. This is because it may be presumed that $TaO_x$ exhibits a resistance changing phenomenon when x is within this range. The reason will be explained in conjunction with the mechanism of resistance change later. The reason why it may be presumed that $TaO_x$ exhibits a resistance changing phenomenon when x is within this range $0<x<2.5$, and experimental data which is the basis for the reason are recited in detail in International Publication WO 2008/059701A1 of International Application PCT/JP2007/070751 which was filed by the present applicant, and see the detailed content.

<Mechanism of Resistance Change>

Hereinafter, a case where an oxygen-deficient tantalum oxide layer and a second oxygen-deficient tantalum oxide layer which is a higher-resistance layer are present between an upper electrode layer and a lower electrode layer will be described. To be specific, in this embodiment, a case where the resistive layer 16 comprises an oxygen-deficient tantalum oxide and the resistance variable layer 31 comprises an oxygen-deficient tantalum oxide which is higher in oxygen content than the oxygen-deficient tantalum oxide of the resistive layer 16 will be described.

It is considered that the oxygen-deficient tantalum oxide layer exhibits a resistance changing phenomenon by the fact that oxygen atoms migrate to get together in a region in the vicinity of the interface between the upper electrode layer and the oxygen-deficient tantalum oxide layer, or diffuse from the region, due to an electric field. To be specific, by applying a positive voltage to the upper electrode layer, negatively charged oxygen atoms migrate to get together at the upper electrode layer side and forms a higher-resistance layer, thereby resulting a high-resistance state. On the other hand, by applying a negative voltage to the upper electrode layer, oxygen atoms diffuse into the oxygen-deficient tantalum oxide layer, and its resistance is decreased. If the second oxygen-deficient tantalum oxide layer which is the higher-resistance layer is present at the above interface (to be precise, interface of the oxygen-deficient tantalum oxide layer side), a high voltage is fed to this portion and oxygen is injected into this higher-resistance layer, which increases its oxygen content and becomes close to $Ta_2O_5$ having a stoichiometric composition which is known as an insulator. As a result, the resistance of the nonvolatile memory element itself increases and the nonvolatile memory element changes to the high-resistance state. On the other hand, if the second oxygen-deficient tantalum oxide layer which is the higher-resistance layer is not present at the above interface, then the voltage is applied evenly to the oxygen-deficient tantalum oxide layer, and the higher-resistance layer which is close to the insulator is less likely to be formed in the region in the vicinity of the interface. This brings about a situation where the resistance changing phenomenon occurs less easily. However, once a layer similar to the second oxygen-deficient tantalum oxide layer is created by so-called a forming step of applying a higher voltage than a voltage for operating the element steadily or applying a number of electric pulses, even in a case where the second oxygen-deficient tantalum oxide layer is not present, a stable resistance changing operation could occur thereafter.

In accordance with the above mechanism, it may be said that changing to the high-resistance state occurs more easily by applying an electric pulse having a positive voltage to an electrode in contact with the second oxygen-deficient tantalum oxide layer, and changing to the low-resistance state occurs more easily by applying an electric pulse having a negative voltage to the electrode in contact with the second oxygen-deficient tantalum oxide layer. It should be noted that by creating a layer having a higher-oxygen content which is similar to the second oxygen-deficient tantalum oxide layer in a region of the electrode side which is not in contact with the second oxygen-deficient tantalum oxide layer, by the forming step, a reversed resistance changing operation is allowed to occur. Therefore, it is not necessary to always satisfy the above relationship between the polarity of voltages applied and the resistance values.

In accordance with the above mechanism, it is considered that the oxygen-deficient tantalum oxide $TaO_x$ ($0<x<2.5$) exhibits the resistance changing phenomenon over an entire range of the oxygen content (x). It should be noted that the degree to which the resistance changing phenomenon occurs could be varied depending on the oxygen content. This may be because the electric characteristic of the oxygen-deficient tantalum oxide $TaO_x$ becomes closer to that of an electric conductor (metal) as the oxygen content is less, while the electric characteristic of the oxygen-deficient tantalum oxide $TaO_x$ becomes closer to that of an insulator as the oxygen content is more, and in either case, the degree to which resistance change affects the resistance value becomes less.

<Embodiment>

In this embodiment, a $TaO_x$ layer ($0<x<2.5$) is used as the resistive layer 16 and $TaO_y$ ($x<y$) is used as the resistance variable layer 31.

In accordance with the configuration of the nonvolatile memory element 10A of Embodiment 1 as described above, since the resistance variable layer 31 is entirely located within the resistive layer 16, when viewed in the thickness direction of the substrate 11, the resistance variable layer 31 constituting the memory section is less likely to be affected by the damages to the resistive layer 16 which would be caused by dry etching or the like in manufacturing process steps. As a result, it is possible to prevent the upper electrode layer 19 and the lower electrode layer 15 from decreasing its resistance (getting short-circuited) or increasing its resistance (getting open-circuited), and hence attain a stable memory capability.

In the nonvolatile memory element 10A of this embodiment, the memory section is the resistance variable layer 31 sandwiched between the lower electrode layer 15 and the upper electrode layer 19 and is formed at the bottom of the contact hole 26. For this reason, a basic constituent unit of the memory element having the memory section is determined by a manufacturing process step of the contact hole formed in the interlayer insulating layer 17 and filled with the lower electrode layer 19. Therefore, the basic constituent unit of the memory element can be miniaturized up to a minimum size of a process rule in the manufacturing process step. As a result, the nonvolatile memory element 10A can be miniaturized.

[Manufacturing Method of Nonvolatile Memory Element]

The following will describe a manufacturing method of the nonvolatile memory element 10A configured as described above.

FIGS. 2A to 2D are cross-sectional views sequentially showing steps from a step of forming the lower electrode layer to a step of forming the contact hole in the manufacturing method of the nonvolatile memory element according to Embodiment 1 of the present invention. FIGS. 3A to 3C are cross-sectional views sequentially showing steps from a step of forming the resistance variable layer to a step of forming the wire layer.

Figure 2A:
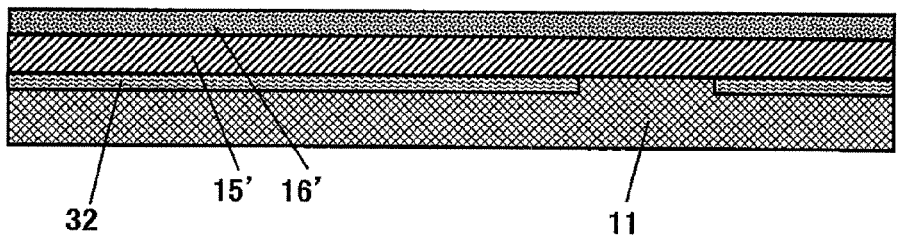
FIGS. 2A to 2D are cross-sectional views sequentially showing steps from a step of forming a lower electrode layer to a step of forming a contact hole in a manufacturing method of the nonvolatile memory element according to Embodiment 1 of the present invention.
Figure 3A:
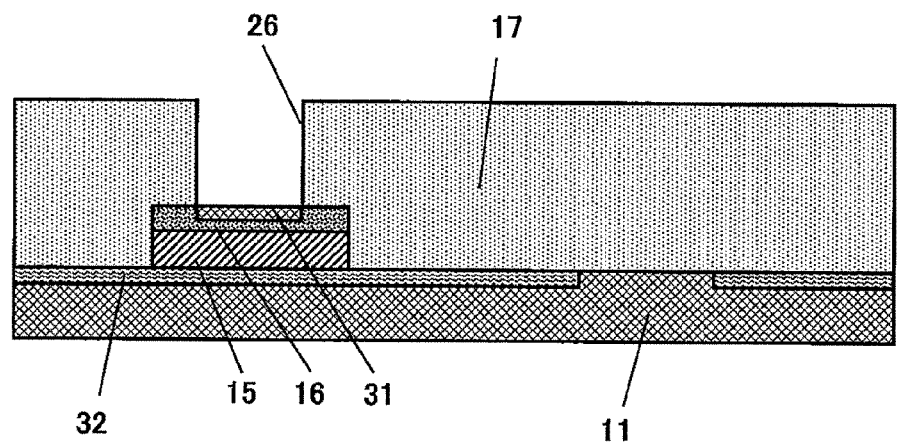
FIGS. 3A to 3C are cross-sectional views sequentially showing steps from a step of forming a resistance variable layer to a step of forming a wire layer.
Figure 3B:
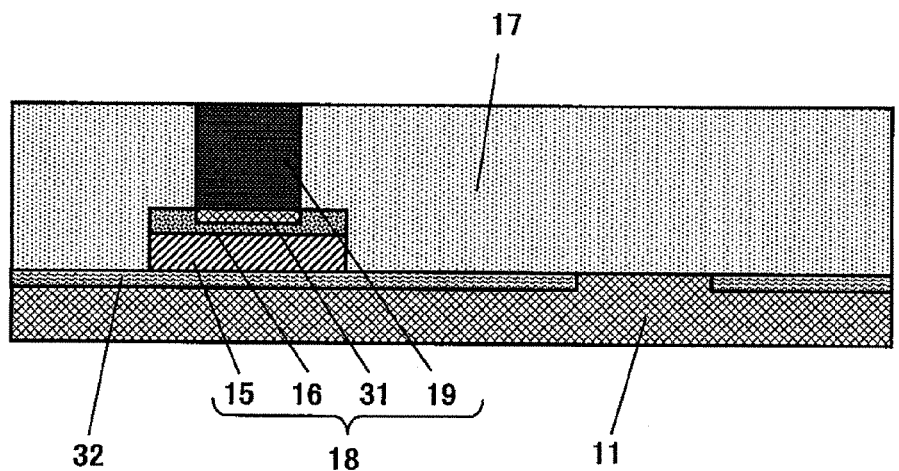
Figure 3C:
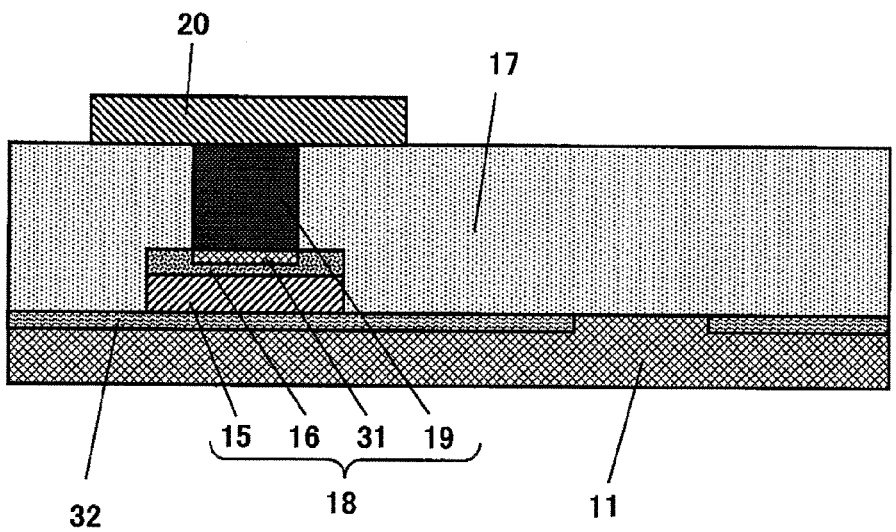

In the step of FIG. 2A, over the substrate 11 provided with the predetermined wire pattern 32, a lower electrode layer 15' and a resistive layer 16' are deposited in this order by sputtering, CVD, or the like. As the material of the resistive layer 16', the oxygen-deficient tantalum oxide $TaO_x$ ($0<x<2.5$) is used, in this embodiment. Hereinafter, the term "layer is formed" means a state where the layer is etched in a predetermined pattern shape, but may be meant to include a case where the layer is deposited. As the material of the lower electrode layer 15', aluminum (Al), copper (Cu), tantalum nitride (TaN), or the like is used.

Figure 2B:
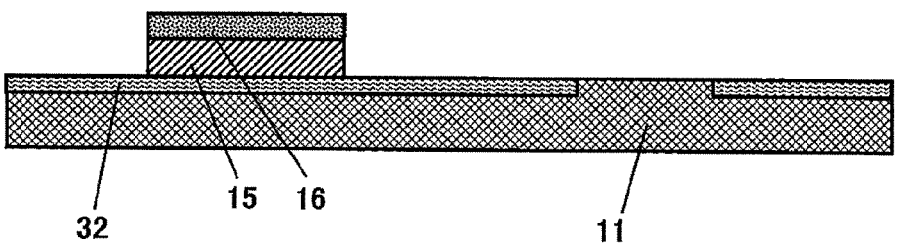

Then, in the step of FIG. 2B, a mask pattern having a predetermined pattern shape is formed by normal photolithography process, and the lower electrode layer 15' and the resistive layer 16' which are stacked together are etched using the mask pattern as a mask. After that, the mask pattern is removed. Thus, a stacked structure of the lower electrode layer 15 and the resistive layer 16 which is patterned in the predetermined shape is formed. To be precise, the resistive layer 16 is an original layer formed into the resistance variable layer 31 which is an oxidized portion formed by partially oxidizing the resistive layer 16 and the remaining portion of the resistive layer 16 (see FIG. 3A).

Figure 2C:
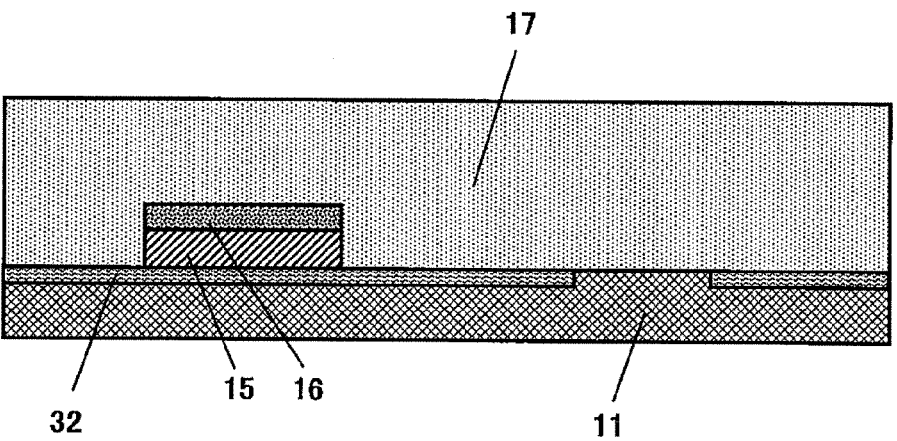

Then, in the step of FIG. 2C, the interlayer insulating layer 17 is deposited by CVD or the like to cover the stacked structure of the lower electrode layer 15 and the resistive layer 16. After that, the interlayer insulating layer 17 is planarized by CMP process (chemical mechanical polishing process).

Figure 2D:
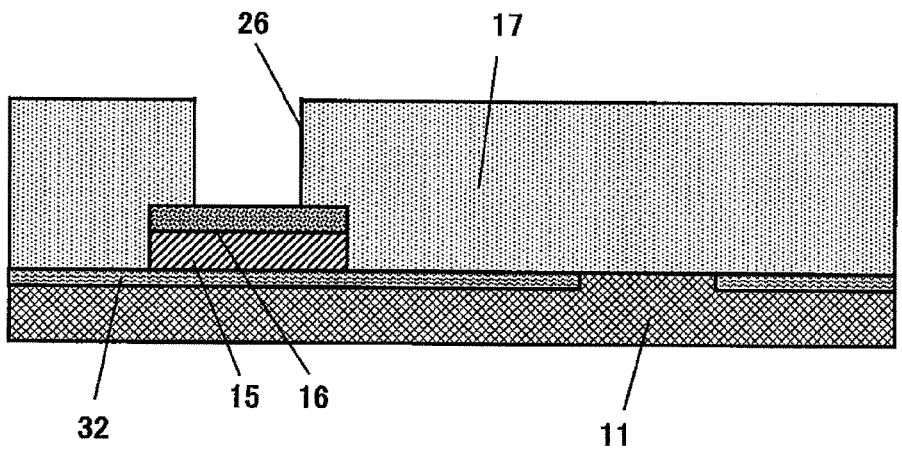

Then, in the step of FIG. 2D, a mask pattern having an opening above a predetermined location on the resistive layer 16 (to be precise, on the stacked structure of the lower electrode layer 15 and the resistive layer 16) is formed over the interlayer insulating layer 17 by normal photolithography process. After that, by using the mask pattern as a mask, the interlayer insulating layer 17 is dry-etched, thereby forming the contact hole 26. After that, the mask pattern is removed. As can be seen from FIG. 2D and FIG. 1A, the contact hole 26 is formed such that the entire bottom thereof is located within the resistive layer 16, when viewed in the thickness direction of the substrate 11. Thus, only the resistive layer 16 is exposed at the bottom of the contact hole 26.

Then, in the step of FIG. 3A, a portion of the resistive layer 16 which is exposed at the bottom of the contact hole 26 is subjected to plasma oxidization process, for example, in oxygen atmosphere, with an application power of 1100 W for a processing time of 30 seconds. Thereby, active oxygen, oxygen ions or oxygen atoms diffuse from the surface of the portion of the resistive layer 16 which is exposed at the bottom of the contact hole 26 into the resistive layer 16 and are taken into a region (designated by reference symbol 31) from the surface of the portion of the resistive layer which is 16 exposed at the bottom of the contact hole 26 to a certain depth (thickness). This allows the region 31 to have a higher oxygen content than the remaining region (region other than the region designated by reference symbol 31) of the resistive layer 16. This region 31 constitutes the resistance variable layer. In this plasma oxidization process, the resistance variable layer 31 is formed to extend from the surface of the portion of the resistive layer 16 which is exposed at the bottom of the contact hole 26 to a certain depth of about 10 nm.

When the resistive layer 16 comprises the oxygen-deficient tantalum oxide $TaO_x$ (0<x<2.5), the resistance variable layer 31 comprises $TaO_y$ (0<y<2.5, x<y).

When the resistive layer 16 comprises $TaO_x$, $TaO_x$ which is the resistive layer 16 is formed and then its surface is oxidized to form the resistance variable layer 31. This makes it easy to control the concentration of the higher-concentration oxide layer (resistance variable layer 31) and the concentration of the lower-concentration oxide layer (resistive layer 16).

Although in the step of forming the resistance variable layer 31, the plasma oxidization process is performed in oxygen atmosphere, the present invention is not limited to this, but it is sufficient that at least one of heating process (hereinafter thermal oxidization process) in oxygen-containing atmosphere, plasma oxidization process in oxygen-containing atmosphere, and oxygen ion implantation is performed. Hereinafter, the thermal oxidization process, the plasma oxidization process and the ion implantation are collectively referred to as oxidization process.

Alternatively, when the resistive layer 16 comprises the oxygen-deficient tantalum oxide $TaO_x$ (0<x<2.5), the resistance variable layer 31 may be formed by a forming step instead of the above oxidization process. For example, in order to drive a nonvolatile memory element having a potential to change its resistance state in response to an electric pulse having a magnitude of 2V and a width of 100 ns, an electric pulse (e.g., voltage value: +3V to the upper electrode on the basis of the lower electrode, pulse width: 100 ns, the number of times: 40) different from the electric pulse is applied to the nonvolatile memory element just after manufacturing, thereby forming the resistance variable layer 31.

Then, in the step of FIG. 3B, the upper electrode layer (not shown) is deposited over the interlayer insulating layer 17 and into the contact hole 26 by sputtering, CVD, or the like. As the material of the upper electrode layer, for example, the electrically-conductive material such as tungsten (W), or platinum (Pt), is used. Then, by CMP, another planarization process, or the like, a portion of the upper electrode layer which is present over the interlayer insulating layer 17 is polished and removed. Thereby, the upper electrode layer is left only inside the contact hole 26 and constitutes the upper electrode layer 19. The upper electrode layer 19 is connected to the resistance variable layer 31.

Then, in the step of FIG. 3C, a wire layer (not shown) is deposited over the interlayer insulating layer 17 and the upper electrode layer 19 by sputtering, CVD, or the like. As the material of the wire layer, for example, aluminum (Al), copper (Cu), or the like is used. Then, the mask pattern having a predetermined pattern shape is formed over the wire layer by normal photolithography process. The mask pattern is formed so that the wire layer which will be left by etching extends through the upper end of the upper electrode layer 19. Then, using the mask pattern as a mask, the wire layer is dry-etched. Then, the mask pattern is removed. As a result, the wire layer 20 is formed such that it is connected to the upper electrode layer 19.

The wire pattern 32 and the wire layer 20 formed as described above are electrically connected to the semiconductor integrated circuit (not shown) formed on the substrate 11. This allows the semiconductor integrated circuit to be electrically connected to the lower electrode layer 15 and the upper electrode layer 19 of the nonvolatile memory element 10A. The semiconductor integrated circuit is formed in manufacturing process steps similar to those of the conventional method.

In the manner as described above, the nonvolatile memory element 10A shown in FIG. 1 is manufactured.

A nonvolatile memory device including, for example, one transistor/one nonvolatile memory section can be manufactured using the nonvolatile memory element 10A.

In accordance with the above described manufacturing method of the nonvolatile memory element of this embodiment, the resistance variable layer 31 sandwiched between the lower electrode layer 15 and the upper electrode layer 19 constitutes the memory section and is formed at the bottom of the contact hole 26. The resistance variable layer 31 is formed by oxidizing a portion of the resistive layer 16 which is exposed in the contact hole 26 and located inwardly relative to the end surface of the resistive layer 16 which would be affected by process damages due to etching or the like, such as side wall leak (decreasing of the resistance) or increasing of the resistance. Therefore, degradation of the characteristic (short-circuited or open-circuited) which would be caused by the process damage, can be prevented.

In accordance with the above described manufacturing method of the nonvolatile memory element, the nonvolatile memory element can be formed on a flat substrate by individual process steps of normal semiconductor process steps. Because of this, the nonvolatile memory element can be manufactured in a standard manner by the same mask process (e.g., CMOS process) as the mask process for forming the constituents other than the memory section. As a result, the nonvolatile memory element with high reliability is easily attainable in simple process steps.

[Operation of Nonvolatile Memory Element]

The following will describe the operation of the nonvolatile memory element 10A configured as described above.

In the nonvolatile memory element 10A, a first predetermined electric pulse (current pulse or voltage pulse) is applied between the lower electrode layer 15 and the upper electrode layer 19. This electric pulse is applied to the resistance variable layer 31 disposed between the lower electrode layer 15 and the upper electrode layer 19. Thereby, the resistance value of the resistance variable layer 31 becomes a first predetermined resistance value and its state is retained. When a second predetermined electric pulse is applied between the lower electrode layer 15 and the upper electrode layer 19 in this state, the resistance value of the resistance variable layer 31 becomes a second predetermined resistance value and its state is retained.

The first predetermined resistance value and the second predetermined resistance value correspond to, for example, two values of binary data, respectively. As a result, the binary data can be written to the nonvolatile memory element 10A by applying the first or second predetermined electric pulse to the resistance variable layer 31. In addition, by feeding a voltage or current to the nonvolatile memory element 10A while preventing the resistance value of the resistance variable layer 31 from changing and by detecting the resistance value, the binary data written in the nonvolatile memory element 10A can be read.

As described above, the resistance variable layer 31 disposed between the lower electrode 15 and the upper electrode layer 19 operates as the memory section.

EXAMPLES

Hereinafter, Examples of this embodiment will be described. In Example 1, in the above described manufacturing method of the nonvolatile memory element, $TaO_x$ was used as the material of the resistive layer 16 and the resistive layer 16 was subjected to the plasma oxidization process as the oxidization process to form the resistance variable layer 31 $TaO_y$. $TaO_x$ which was the material of the resistive layer 16 had a composition of x=1.8, and $TaO_y$ which was the material of the resistance variable layer 31 had a composition of y=2.49.

In Example 2, in the above described manufacturing method of the nonvolatile memory element, $TaO_x$ was used as the material of the resistive layer 16 and the resistive layer 16 was subjected to the thermal oxidization process as the oxidization process to form the resistance variable layer 31. $TaO_x$ which was the material of the resistive layer 16 had a composition of x=1.8, and $TaO_y$ which was the material of the resistance variable layer 31 had a composition of y=2.49.

In the nonvolatile memory element of Example 1, when a pulse voltage (pulse width: 100 ns) of 2V was applied between the upper electrode layer 19 and the lower electrode layer 15 without a forming step, the resistance value of the nonvolatile memory element became 30000 ohm, and when a pulse voltage (pulse width: 100 ns) of −1V was applied between the upper electrode layer 19 and the lower electrode layer 15, the resistance value of the nonvolatile memory element became 2000 ohm. In the nonvolatile memory element of Example 2, when a pulse voltage (pulse width: 100 ns) of 1.8V was applied between the upper electrode layer 19 and the lower electrode layer 15 without a forming step, the resistance value of the nonvolatile memory element became 20000 ohm, and when a pulse voltage (pulse width: 100 ns) of −1V was applied between the upper electrode layer 19 and the lower electrode layer 15, the resistance value of the nonvolatile memory element became 1300 ohm.

When the above different voltage pulses were applied alternately to each of the nonvolatile memory element of Example 1 and to the nonvolatile memory element of Example 2, plural times, the resistance values of each of the nonvolatile memory elements changed reversibly.

The above contents are illustrated in Table 1.

TABLE 1

| | Resistive layer 16 | Oxidization process step | Applied voltage (V) | Resistance value (ohm) | Applied voltage (V) | Resistance value (ohm) |
|---|---|---|---|---|---|---|
| Example 1 | TaOx | Plasma oxidization | 2 | 30000 | −1 | 2000 |
| Example 2 | | Thermal oxidization | 1.8 | 20000 | −1 | 1300 |

As can be seen from Example 1 and Example 2, it was verified that a nonvolatile memory element which stably performed a resistance changing operation (memory operation) was attainable by using $TaO_x$ as the material of the resistive layer 16 and by forming the resistance variable layer 31 by oxidizing the resistive layer 16, in the nonvolatile memory element 10A of this embodiment.

In addition to the above, it was confirmed that a nonvolatile memory element in Example (not recited) in which the resistance variable layer 31 was formed from the resistive layer comprising $TaO_x$ as the material, by a forming step instead of the oxidization process, performed a resistance changing operation stably in the same manner.

(Embodiment 2)

Figure 4A:
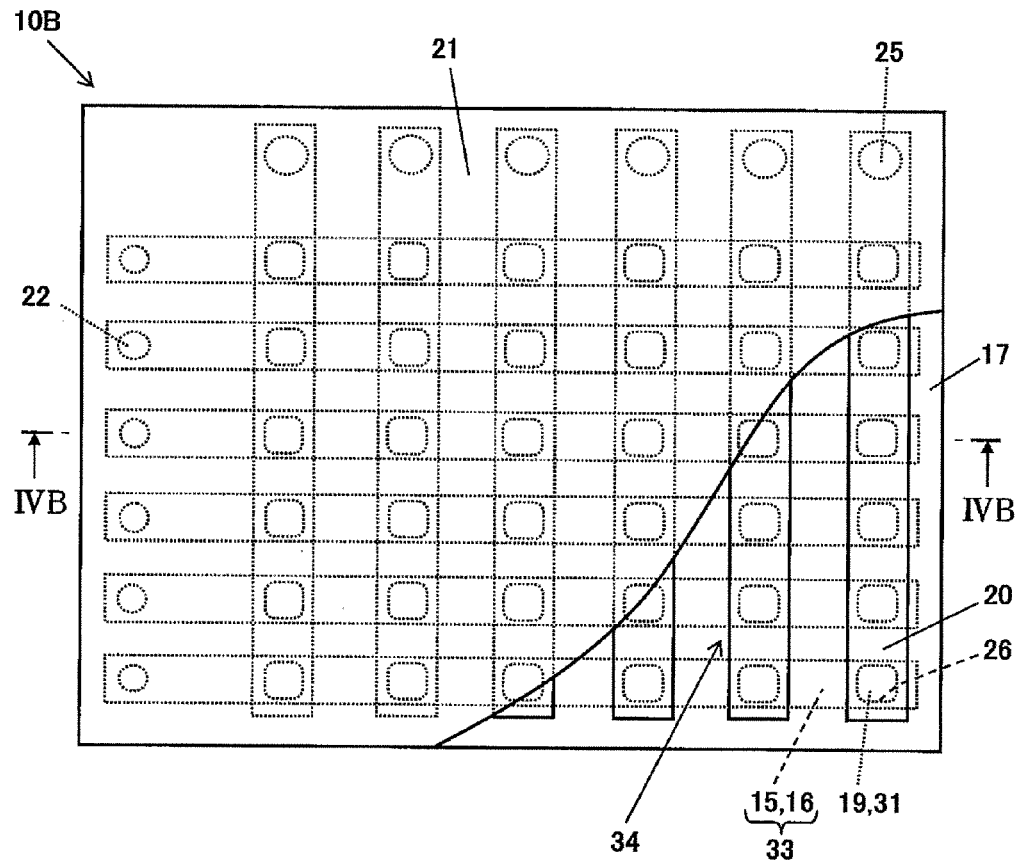
Figure 4B:
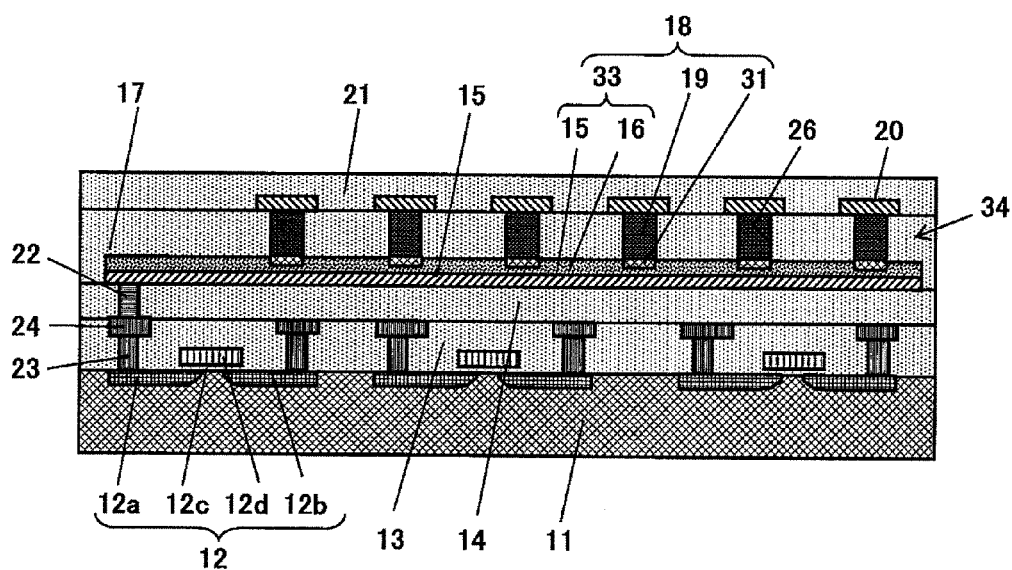

FIGS. 4A and 4B are views showing a configuration of a nonvolatile memory element according to Embodiment 2 of the present invention, in which FIG. 4A is a plan view, and FIG. 4B is a cross-sectional view taken along line IVB-IVB of FIG. 4A. In FIG. 4A, the nonvolatile memory element is depicted in such a manner that a passivation layer 21 which is an uppermost layer is partially cut away for the purpose of easier understanding.

A nonvolatile memory element 10B of this embodiment is such that the nonvolatile memory element 10A of Embodiment 1 is configured as a cross-point memory element. Since the basic constituents of the nonvolatile memory element 10B of this embodiment are identical to those of the nonvolatile memory element 10A of Embodiment 1, a difference between them will be in a larger part described.

As shown in FIGS. 4A and 4B, in the nonvolatile memory element 10B of this embodiment, on the substrate 11 (to be precise, on the substrate 11 with the first interlayer insulating layer 13 and the second interlayer insulating layer 14 interposed), a plurality of band-shaped first wire layers 33 are formed at specified pitches to extend in parallel with each other within a plane parallel to the main surface of the substrate 11. Although the plurality of first wire layers 33 are formed in this way in this embodiment, the present invention is not limited to this so long as they are arranged to be spaced apart from each other to extend in parallel with each other. Each of the first wire layers 33 has a stacked structure in which the band-shaped resistive layer 16 is stacked on the band-shaped lower electrode layer 15. The lower electrode layer 15 and the resistive layer 16 are stacked together such that they substantially entirely overlap with each other when viewed in the thickness direction of the substrate 11.

A plurality of band-shaped second wire layers 20 are formed above the plurality of first wire layers 33 at specified pitches to extend in parallel with each other within a plane parallel to the main surface of the substrate 11. The configuration of the plurality of second wire layers 20 is not limited to this so long as they are arranged to be spaced apart from each other to extend in parallel with each other. The second wire layer is such that the first wire layer 20 of Embodiment 1 is formed to have a band shape. The plurality of (all of) second wire layers 20 are formed to cross the plurality of (all of) first wire layers 33 at a right angle, respectively. The configuration of the plurality of (all of) the second wire layers 20 is not limited to this so long as they cross the plurality of (all of) first wire layers 33, respectively.

Over the substrate 11 (to be precise, over the substrate 11 with the first interlayer insulating layer 13 and the second interlayer insulating layer 14 interposed), a third interlayer insulating layer 17 is formed to cover the plurality of first wire layers 33 and to intervene between the plurality of first wire layers 33 and the second plurality of second wire layers 20. In this embodiment, the plurality of second wire layers 20 are formed on the third interlayer insulating layer 17 covering the plurality of first wire layers 33. The third interlayer insulating layer 17 corresponds to the first interlayer insulating layer 17 of Embodiment 1.

Like the nonvolatile memory element 10A of Embodiment 1, the contact hole 26 is formed to penetrate the third interlayer insulating layer 17 and extend from the second wire layer 20 to the resistance variable layer 31, at a cross-point (three-dimensional cross-point of each of the first wire layers 33 and a corresponding one of the second wire layers 20) of each of the first wire layers 33 and a corresponding one of the second wire layers 20, when viewed in the thickness direction of the substrate 11, and the upper electrode layer 19 is formed inside the contact hole 26.

In the cross-point nonvolatile memory element 10B of this embodiment, a unit memory element (memory cell) 18 is configured to include the lower electrode layer 15, the resistive layer 16, the resistance variable layer 31 and the upper electrode layer 19. The unit memory elements 18 are formed at the three-dimensional cross-points 34 of all of the first wire layers 33 and all of the second wire layers 20. All of the unit memory cells 18 corresponding to each first wire layer 33 share the lower electrode layer 15 and the resistive layer 16 constituting this first wire layer 33.

The passivation layer 21 is formed over the third interlayer insulating layer 17 to cover the plurality of second wire layers 20.

In this embodiment, the substrate 11 is made of a silicon monocrystalline substrate. The substrate 11 is provided with a semiconductor circuit including active elements 12 such as transistors which are integrated thereon, without any constituents intervening between them. The cross-point nonvolatile memory element 10B and the semiconductor integrated circuit constitute the nonvolatile memory device. FIG. 4B shows the active element 12 as a constituent of the semiconductor circuit. As the active element, a transistor including a source region 12a, a drain region 12b, a gate insulating layer 12c and a gate electrode 12d is depicted. However, the semiconductor circuit generally includes elements required for a memory circuit, such as DRAM, as well as the active element 12.

In this embodiment, the semiconductor circuit including the active element 12 is formed on the substrate 11, and the first interlayer insulating layer 13 is formed to fill a space between the constituents in the semiconductor circuit. The constituents in the semiconductor circuit are connected to each other via a semiconductor circuit wire 24 formed on the first interlayer insulating layer 13 and a contact 23 penetrating the first interlayer insulating layer 13. The second interlayer insulating layer 14 is formed over the first interlayer insulating layer 13. On the second interlayer insulating layer 14, the cross-point nonvolatile memory element (to be precise, a portion of the cross-point nonvolatile memory element 10B except for the substrate 11) is formed without any constituents intervening between them. The semiconductor circuit wire 24 is connected to the first wire layer 33 via an embedded electric conductor 22 penetrating the second interlayer insulating layer 14. The semiconductor circuit wire 24 is connected to the second wire layer 20 via the embedded electric conductor 22 penetrating the second interlayer insulating layer 14 and via an embedded electric conductor (not shown) penetrating the third interlayer insulating layer 17.

The following will describe the manufacturing method of the cross-point nonvolatile memory element configured as described above.

FIGS. 5A to 5D are cross-sectional views sequentially showing steps from a step of forming the lower electrode layer to a step of forming the resistance variable layer in the manufacturing method of the nonvolatile memory element according to Embodiment 2 of the present invention. FIGS. 6A and 6C are cross-sectional views sequentially showing steps from a step of forming the upper electrode layer to a step of forming the wire layer. Although in the actual nonvolatile memory element 10B, the first wire layers 33 and the second wire layers 20 are formed in a large number and the unit memory elements 18 are formed at three-dimensional cross-points 34 of the first wire layers 33 and the second wire layers 20, the substrate 11 of the nonvolatile memory element 10B and the active element 12 which can be manufactured in normal manufacturing process steps are omitted and only required constituents (constituents including the second interlayer insulating layer 14 and upper constituents) including the unit memory element 18 are depicted, for the purpose of easier understanding, in FIG. 5A to FIG. 6C. In addition, a part of the constituents are enlarged, for the purpose of easier understanding. Since the basic process steps of the manufacturing method of the nonvolatile memory element of this embodiment are identical to those of the manufacturing method of the nonvolatile memory element of Embodiment 1, description of the identical process steps will be omitted or given in a simple way.

Figure 5A:
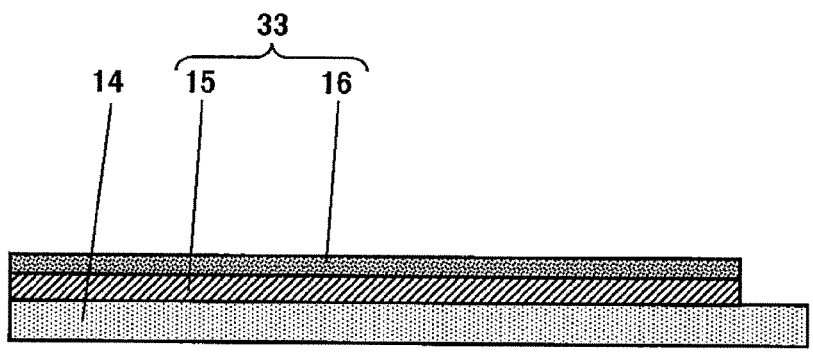
FIGS. 5A to 5D are cross-sectional views sequentially showing steps from a step of forming a lower electrode layer to a step of forming a resistance variable layer in a manufacturing method of the nonvolatile memory element according to Embodiment 2 of the present invention.
Figure 6A:
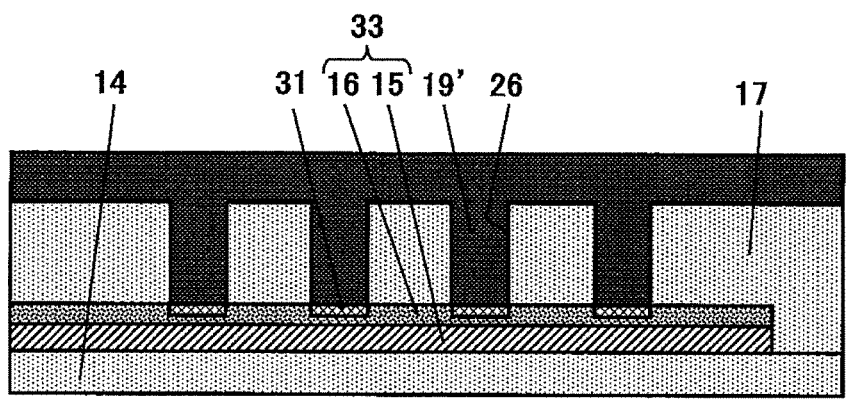
FIGS. 6A to 6C are cross-sectional views sequentially showing steps from a step of forming an upper electrode layer to a step of forming a wire layer.

In the step of FIG. 5A, over the second interlayer insulating layer 14, a lower electrode layer 15' and a resistive layer 16' are deposited in this order. Using a mask pattern having a predetermined shape, these layers are etched, to form stacked structures 33 comprising the plurality of lower electrode layers 15 and the plurality of resistive layers 16. The stacked structures 33 constitute the first wire layers, respectively. As shown in FIG. 4A, the plurality of first wire layers 33 are arranged at specified pitches to extend in parallel with each other.

Figure 5B:
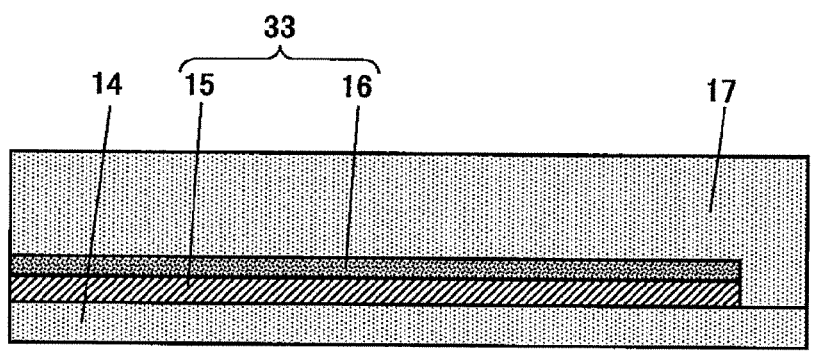

Then, in the step of FIG. 5B, the third interlayer insulating layer 17 is deposited to cover the plurality of first wire layers 33 and planarized.

Figure 5C:
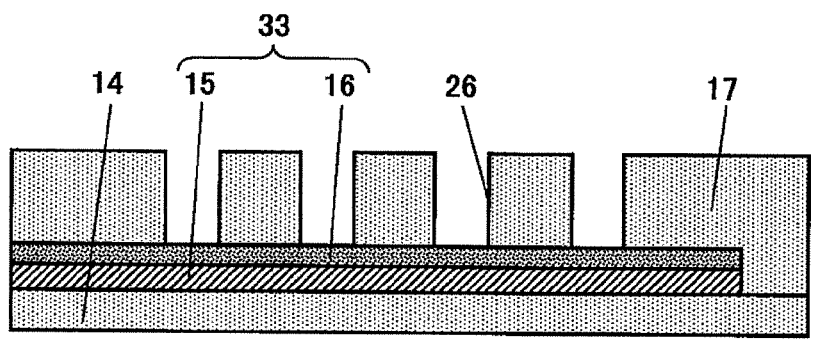

Then, in the step of FIG. 5C, over the third interlayer insulating layer 17, a mask pattern having openings above the plurality of predetermined locations on the respective first wire layers 33 are formed. The plurality of predetermined locations are locations (planned three-dimensional cross-points) where the first wire layers 33 should three-dimensionally cross the plurality of second wire layers 20, respectively, i.e., the three-dimensional cross-points 34 shown in FIG. 4A and 4B. Then, using the mask pattern as a mask, the third interlayer insulating layer 17 is dry-etched to form the contact hole 26, and then the mask pattern is removed.

Figure 5D:
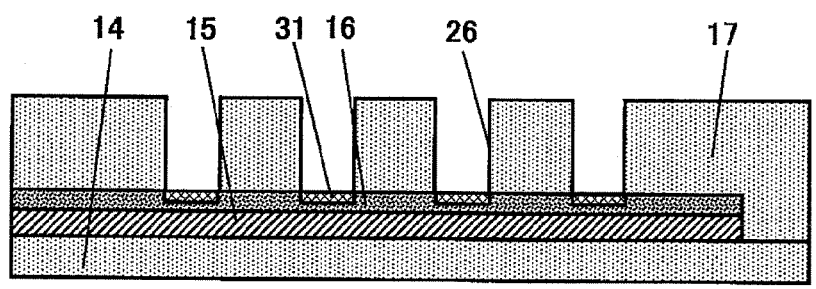

Then, in the step of FIG. 5D, a portion of the resistive layer 16 which is exposed at the bottom of the contact hole 26 is oxidized to form the resistance variable layer 31 at the bottom of the contact hole 26.

Then, in the step of FIG. 6A, an upper electrode layer 19' is deposited over the third interlayer insulating layer 17 and into the contact hole 26'.

Figure 6B:
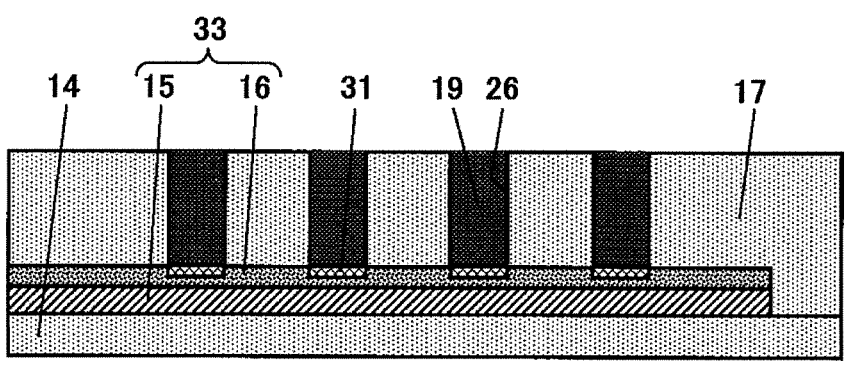
Figure 6C:
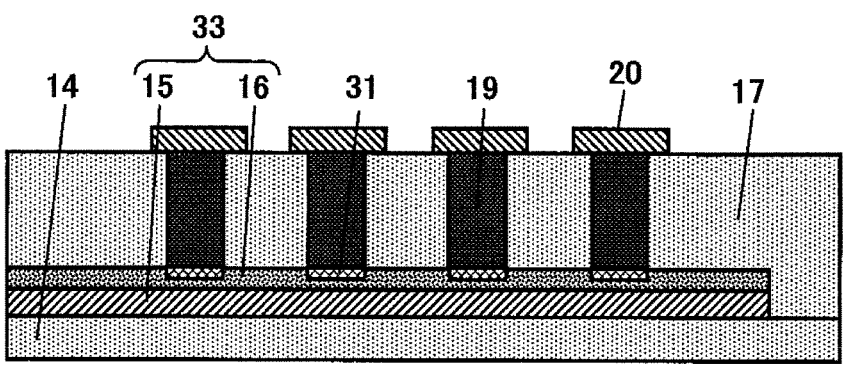

Then, in the step of FIG. 6B, a portion of the upper electrode layer 19' which is present on the third insulating layer 17 is polished and removed by CMP or the like. Thereby, the upper electrode layer 19 is formed only inside the contact hole 26.

Then, in the step of FIG. 6C, a wire layer(not shown) is deposited over the interlayer insulating layer 17 and the upper electrode layer 19, and a mask pattern having a predetermined shape is formed over the wire layer. Using the mask pattern as a mask, these layers are etched to form the plurality of band-shaped second wire layers 20. Then, the mask pattern is removed. As shown in FIG. 4A, the plurality of second wire layers 20 are arranged at specified pitches to extend in parallel with each other and cross the plurality of first wire layers 33, respectively, at a right angle.

The first wire layers 33 and the second wire layers 20 formed as described above are electrically connected to the semiconductor integrated circuit including the active element 12 provided on the substrate 11. In this way, the semiconductor integrated circuit is electrically connected to the lower electrode layer 15 and the upper electrode layer 19 of the nonvolatile memory element 10B.

In the manner as described above, the nonvolatile memory element 10B shown in FIGS. 4A and 4B is manufactured. Using the nonvolatile memory element 10B, for example, the cross-point large capacity nonvolatile memory element can be manufactured.

In accordance with this embodiment, it is possible to provide a cross-point nonvolatile memory element which can be miniaturized and has a stable memory capability, and a manufacturing method thereof.

(Embodiment 3)

Figure 7A:
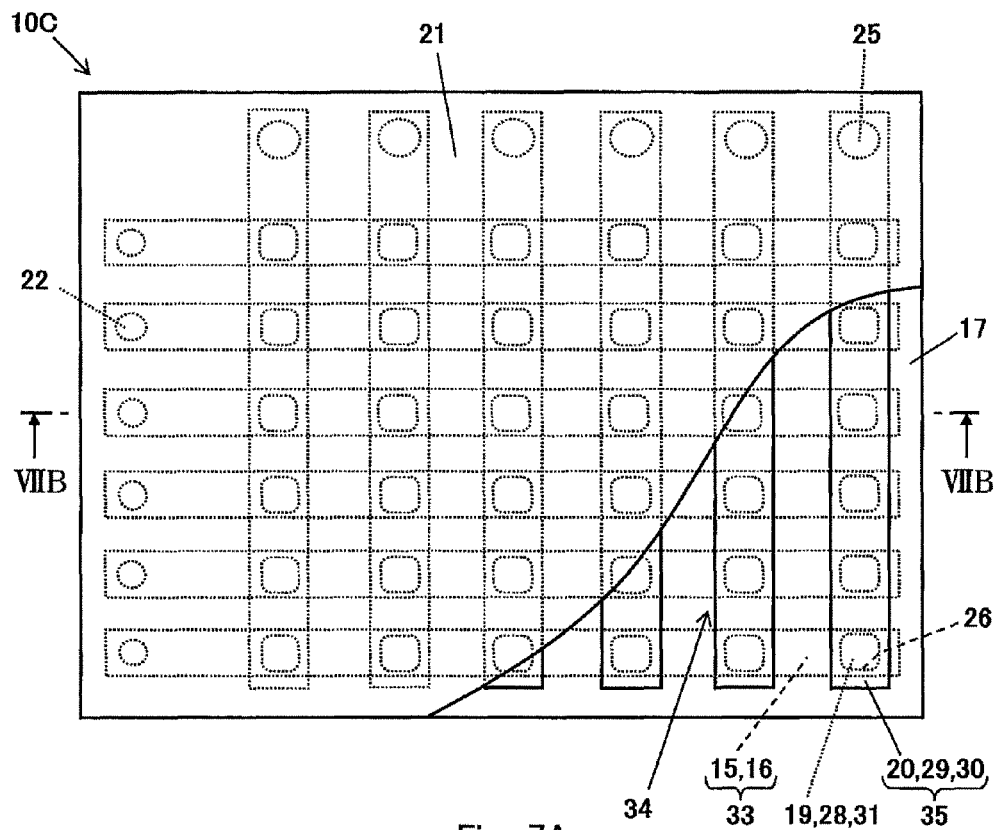
Figure 7B:
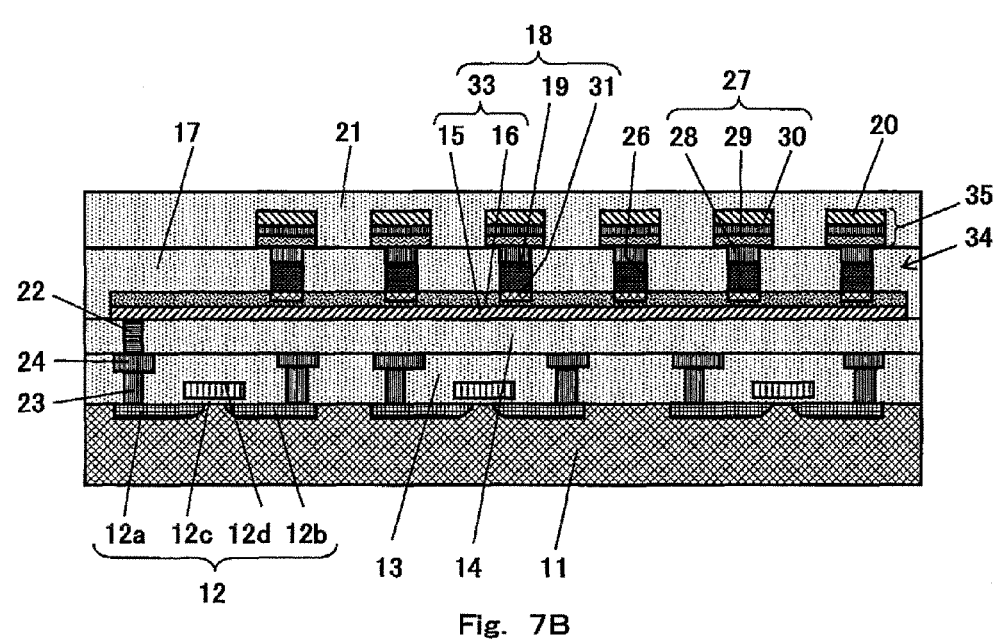

FIGS. 7A and 7B are views showing a configuration of a nonvolatile memory element according to Embodiment 3 of the present invention, in which FIG. 7A is a plan view, and FIG. 7B is a cross-sectional view taken along line VIIB-VIIB of FIG. 7A. In FIG. 7A, the nonvolatile memory element is depicted in such a manner that an passivation layer 21 which is an uppermost layer is partially cut away for the purpose of easier understanding.

As shown in FIGS. 7A and FIG. 7B, a nonvolatile memory element 10C of this embodiment is identical to the nonvolatile memory element 10B of Embodiment 2 except that a non-ohmic element 27 is disposed between the resistance variable layer 31 and the second wire layer 20 in the nonvolatile memory element 10C. Hereinafter, this difference will be in a larger part described.

To be specific, the non-ohmic element 27 is a well-known element represented by a MIM diode (metal-insulator-metal diode), a MSM diode (metal-semiconductor-metal diode), a varistor, and so on. The non-ohmic element 27 is required to have a voltage-current characteristic in which an increasing rate of an absolute value of a current with respect to an increase in an absolute value of a voltage increases as the absolute value of the voltage increases, in at least a certain voltage range. The increasing rate of the absolute value of the current with respect to the increase in the absolute value of the voltage is a (differential) conductivity. Because of such a voltage-current characteristic, the non-ohmic element 27 is placed in an approximately non-electrically-conductive state in a relatively low voltage (absolute value) range and in an approximately electrically-conductive state in a relatively high voltage (absolute value) range, in a certain voltage range. When a pulse having a suitable voltage in the relatively high voltage range is applied to a selected unit memory element 18, the selected unit memory element 18 changes its resistance. The voltage pulse is applied to an unselected unit memory element 18, which is a part of the unit memory elements 18, via a unit memory element 18 in a low-resistance state, but its voltage is in the relatively lower voltage range, and therefore the unselected unit memory element 18 does not change its resistance. As a result, a cross talk of the voltage pulse is prevented. In a case where the resistance variable layer 31 changes its resistance by applying two electric pulses with different polarities, the non-ohmic element 27 is required to have the above voltage-current characteristic with respect to positive and negative voltages. On the other hand, in a case where the resistance variable layer 31 changes its resistance by applying two electric pulses with the same polarity, the non-ohmic element 27 is required to have the above voltage-current characteristic with respect to only either one of positive and negative voltages. In this case, as the non-ohmic element 27, a normal diode may be used.

In this embodiment, the non-ohmic element 27 has, for example, a structure, in which a non-ohmic material layer 29 is sandwiched between a first electrode 28 and a second electrode 30. In a case where the non-ohmic element 27 is the MSM diode, for example, nitrogen-deficient silicon nitride (SiNx) is used as the non-ohmic material layer 29, and for example, tantalum nitride (TaN) or tungsten (W) is used as the materials of the first electrode 28 and the second electrode 30. In a case where the non-ohmic element 27 is the MIM diode, an insulator is used as the non-ohmic material layer 29, and suitable metals are used as the materials of the first electrode 28 and the second electrode 30.

In this embodiment, at each three-dimensional cross-point 34, the upper electrode layer 19 and the first electrode 28 are sequentially stacked inside the contact hole 26. For each second wire 20, a stacked structure 35 including the band-shaped non-ohmic material layer 29 formed on the third interlayer insulating layer, the band-shaped second electrode 30 formed on the non-ohmic material layer 29, and the band-shaped second wire layer 20 formed on the second electrode 30 is formed. In this stacked structure 35, the non-ohmic material layer 29, the second electrode 30 and the second wire layer 20 are stacked together such that they overlap with each other substantially entirely when viewed in the thickness direction of the substrate 11. In the above described manner, a configuration in which the non-ohmic element 27 including the first electrode 28, the non-ohmic material layer 29 and the second electrode 30 is disposed between the upper electrode layer 19 and the second wire layer 20 constituting the unit nonvolatile memory element 18, is implemented.

The following will describe a manufacturing method of the nonvolatile memory element 10C according to Embodiment 3 configured as described above.

Figure 8:
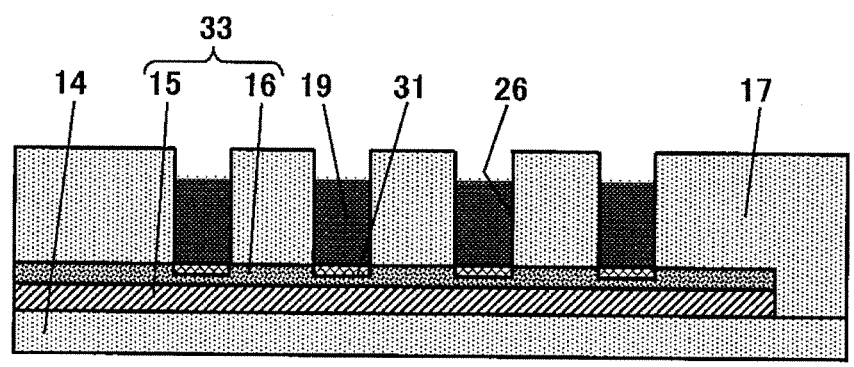
FIG. 8 is a cross-sectional view showing an upper electrode layer etching step in a manufacturing method of the nonvolatile memory element according to Embodiment 3 of the present invention.
Figure 9A:
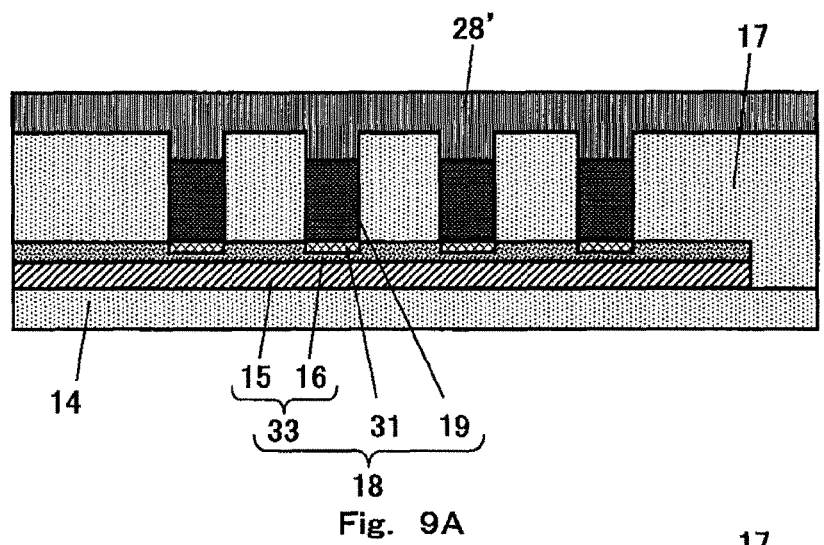
FIGS. 9A to 9C are cross-sectional views sequentially showing steps from a step of depositing a first electrode layer to a step of forming a second wire layer in the manufacturing method of the nonvolatile memory element according to Embodiment 3 of the present invention.
Figure 9B:
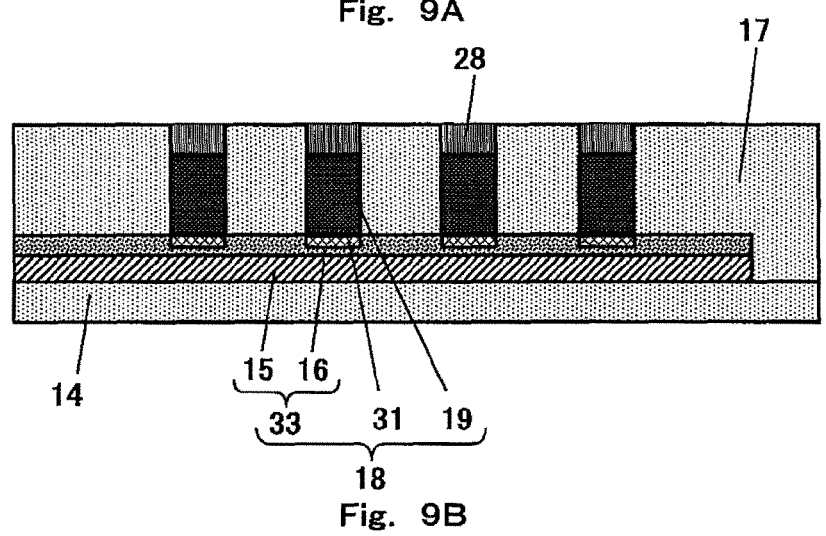
Figure 9C:
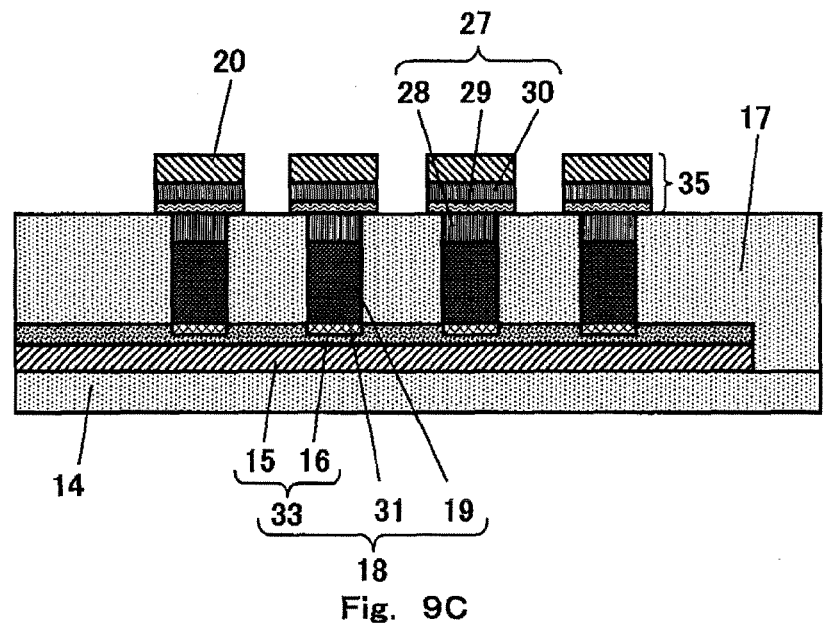

FIG. 8 is a cross-sectional view showing an upper electrode layer etching step in the manufacturing method of the nonvolatile memory element according to Embodiment 3 of the present invention. FIGS. 9A to 9C are cross-sectional views sequentially showing steps from a step of depositing the first electrode layer to a step of forming the second wire layer in the manufacturing method of the nonvolatile memory element according to Embodiment 3 of the present invention.

The step of forming the upper electrode layer 19 shown in FIG. 6B and the preceding steps in the manufacturing method of the nonvolatile memory element of this embodiment are identical to those of the manufacturing method of the nonvolatile memory element according to Embodiment 2, and will not be described repetitively.

In this embodiment, after the upper electrode layer 19 is formed in the step of FIG. 6B, the upper electrode layer 19 formed in the contact hole 26 is selectively etched to form a recess in the layer in the contact hole 26.

Then, in the step of FIG. 9A, a first electrode layer 28' is deposited over the third interlayer insulating layer 17 and into the recess of the contact hole 26.

Then, in the step of FIG. 9A, a portion of the first electrode layer 28' deposited over the third interlayer insulating layer 17 is polished and removed by CMP, or the like. Thereby, the first electrode 28 is formed into the recess of the contact hole 26. The first electrode 28 is connected to the upper electrode layer 19.

Then, in the step of FIG. 9C, a non-ohmic material layer (not shown), a second electrode layer (not shown) and a second wire layer (not shown) are sequentially deposited over the third interlayer insulating layer 17 and the first electrode layer 28, and a mask pattern having a predetermined shape is formed over the deposited layers. Then, using the mask pattern as a mask, these layers are etched, thereby forming the plurality of band-shaped stacked structures 35. Then, the mask pattern is removed. The stacked structures 35 are each formed by sequentially stacking the non-ohmic material layer 29, the second electrode 30 and the second wire layer 20. As shown in FIG. 7A, the plurality of stacked structures 35 are arranged at specified pitches to extend in parallel with each other. Each of the stacked structures 35 is formed to cross the plurality of first wire layers 33 at a right angle.

In accordance with this embodiment, in the cross-point nonvolatile memory element which can be miniaturized and has a stable memory capability, it is possible to prevent a cross talk of voltage pulses and hence a write error and a read error.

In the above described Embodiment 1 to Embodiment 3, the resistive layer 16 and the resistance variable layer 31 substantially comprise predetermined materials, respectively. However, of course, each of the resistive layer 16 and the resistance variable layer 31 may comprise a minute amount of impurities with a normal concentration level, in addition to the predetermined material. Also, each of the resistive layer 16 and the resistance variable layer 31 may comprise added substances (added substances which will not affect a memory characteristic), in addition to the predetermined material.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

Industrial Applicability

A nonvolatile memory element of the present invention is useful in the uses of a variety of electronic equipment such as digital home appliance, memory cards, cellar phones, and personal computers.

A manufacturing method of the nonvolatile memory element of the present invention is useful as a manufacturing method of nonvolatile memory elements incorporated into a variety of electronic equipment such as digital home appliance, memory cards, cellar phones, and personal computers.

| Reference Signs Lists | |
| --- | --- |
| 10A, 10B, 10C | nonvolatile memory element |
| 11 | substrate |
| 12 | active element |
| 12a | source region |
| 12b | drain region |
| 12c | gate insulating layer |
| 12d | gate electrode |
| 13 | first interlayer insulating layer |
| 14 | second interlayer insulating layer |
| 15 | lower electrode layer |
| 16 | resistive layer |
| 17 | third interlayer insulating layer (interlayer insulating layer) |
| 18 | unit memory element (memory cell) |
| 19 | upper electrode layer |
| 20 | second wire layer (wire layer) |
| 21 | passivation layer |
| 22 | embedded electric conductor |
| 23 | contact |
| 24 | semiconductor circuit wire |
| 26 | contact hole |
| 27 | non-ohmic element |
| 28 | first electrode |
| 29 | non-ohmic material layer |
| 30 | second electrode |
| 31 | resistance variable layer |
| 32 | wire pattern |
| 33 | first wire layer |
| 34 | three-dimensional cross-point |
| 35 | stacked structure |

The invention claimed is:

1. A nonvolatile memory element comprising:
a substrate;
a lower electrode layer formed on the substrate;
a resistive layer formed on the lower electrode layer and comprising an oxygen-deficient metal oxide which is an oxide of metal including an element of one kind or elements of a plurality of kinds which is or are selected from transition metals;
a resistance variable layer formed on the resistive layer and comprising an oxygen-deficient metal oxide which has a higher oxygen content than the resistive layer;
a wire layer formed above the lower electrode layer;
an interlayer insulating layer disposed between the substrate and the wire layer and covering at least the lower electrode layer and the resistive layer, the interlayer insulating layer being provided with a contact hole extending from the wire layer to the resistance variable layer; and
an upper electrode layer formed inside the contact hole such that the upper electrode layer is connected to the resistance variable layer and to the wire layer;
the resistance variable layer having a surface exposed at a bottom of the contact hole;
the upper electrode layer being filled into the contact hole such that a lower surface of the upper electrode layer is connected to the resistance variable layer;
resistance values of the resistance variable layer changing reversibly in response to electric pulses applied between the lower electrode layer and the upper electrode layer.

2. The nonvolatile memory element according to claim 1, wherein the resistance variable layer is entirely located within the resistive layer when viewed in a thickness direction of the substrate, and the contact hole reaches only the resistance variable layer.

3. The nonvolatile memory element according to claim 1, wherein the oxygen-deficient metal oxide is an oxygen-deficient tantalum oxide $TaO_x (0<x<2.5)$.

4. The nonvolatile memory element according to claim 1, wherein the resistance variable layer is formed in such a manner that the lower electrode layer and the resistive layer are sequentially formed on the substrate, then the interlayer insulating layer is formed over the substrate to cover the lower electrode layer and the resistive layer, then the contact hole is formed to penetrate the interlayer insulating layer and reach the resistive layer, and then a portion of the resistive layer which is exposed at a bottom of the contact hole is oxidized.

5. The nonvolatile memory element according to claim 1, comprising:
a first wire layer formed in a band shape on the substrate; and a second wire layer formed above the first wire layer in a band shape to three-dimensionally cross the first wire layer, the second wire layer being the wire layer;
wherein the first wire layer has a structure in which the lower electrode layer formed in a band shape and the resistive layer formed in a band shape are sequentially stacked on the substrate;
the resistance variable layer is formed on a portion of the resistive layer of the first wire layer which is located at a three-dimensional cross-point of the first wire layer and the second wire layer;
the interlayer insulating layer is disposed between the substrate and the second wire layer, is provided with the contact hole extending from the second wire layer to the resistance variable layer, and covers at least the first wire layer; and the upper electrode layer is formed inside the contact hole such that the upper electrode layer is connected to the resistance variable layer and to the second wire layer.

6. The nonvolatile memory element according to claim 5, wherein a plurality of first wire layers are arranged to be spaced apart from each other; and a plurality of second wire layers are arranged to be spaced apart from each other and to cross the plurality of first wire layers, respectively, when viewed in a thickness direction of the substrate; and wherein the resistance variable layer, the contact hole and the upper electrode layer are formed at each of crosspoints of the first wire layers and the second wire layers when viewed in the thickness direction of the substrate.

7. The nonvolatile memory element according to claim 5, wherein the oxygen-deficient metal oxide is an oxygen-deficient tantalum oxide $TaO_x(0<x<2.5)$.

8. The nonvolatile memory element according to claim 5, wherein the resistance variable layer is formed in such a manner that the lower electrode layer and the resistive layer are sequentially stacked in a band shape on the substrate, then the interlayer insulating layer is formed over the substrate to cover the lower electrode layer and the resistive layer, then the contact hole is formed to penetrate the interlayer insulating layer and reach the resistive layer, and then a portion of the resistive layer which is exposed at a bottom of the contact is oxidized.

9. The nonvolatile memory element according to claim 5, wherein a non-ohmic element is formed between the lower electrode layer and the second wire layer such that the non-ohmic element is connected in series with the resistance variable layer; and the non-ohmic element has a voltage-current characteristic in which an increasing rate of an absolute value of a current with respect to an increase in an absolute value of a voltage increases as the absolute value of the voltage increases, in at least a certain voltage range.

10. The nonvolatile memory element according to claim 9, wherein the non-ohmic element is formed between the resistance variable layer and the second wire layer.

11. The nonvolatile memory element according to claim 9, wherein the non-ohmic element is a MIM diode, a MSM diode or a varistor.

12. The nonvolatile memory element according to claim 1, wherein the contact hole has a diameter smaller than a size of the resistive layer.

13. The nonvolatile memory element according to claim 1, wherein an upper surface of the resistive layer is coplanar with an upper surface of the resistance variable layer.

* * * * *